United States Patent [19]

Harrington et al.

[11] 4,438,448
[45] Mar. 20, 1984

[54] ZIG-ZAG V-MOS TRANSISTOR STRUCTURE

[75] Inventors: Alan L. Harrington, Glendale; Richard Allison, Los Angeles; Vladimir Rodov, North Hollywood, all of Calif.

[73] Assignee: TRW Inc., Los Angeles, Calif.

[21] Appl. No.: 170,131

[22] Filed: Jul. 18, 1980

[51] Int. Cl.³ .................. H01L 21/302; H01L 29/04; H01L 29/78
[52] U.S. Cl. ........................................ 357/23; 29/571; 29/580; 156/647; 156/662; 357/55; 357/60; 357/68
[58] Field of Search ................. 357/23 R, 23 VD, 60, 357/55, 68; 156/647, 662; 29/571, 580

[56] References Cited
U.S. PATENT DOCUMENTS

| | | | |
|---|---|---|---|
| 3,354,007 | 11/1967 | Michelitsch | 148/187 |
| 3,414,781 | 12/1968 | Dill | 357/23 R |
| 3,793,712 | 2/1974 | Bean et al. | 29/577 |
| 3,813,585 | 5/1974 | Tarui et al. | 357/60 |
| 3,986,200 | 10/1976 | Allison | 357/60 |
| 4,017,885 | 4/1977 | Kendall et al. | 357/51 |
| 4,029,531 | 6/1977 | Marinelli | 156/647 |
| 4,070,690 | 1/1978 | Wickstrom | 357/23 VD |
| 4,145,703 | 3/1979 | Blanchard et al. | 357/23 VD |
| 4,172,005 | 10/1979 | Maraoka et al. | 357/60 |

*Primary Examiner*—William D. Larkins
*Attorney, Agent, or Firm*—Spensley, Horn, Jubas & Lubitz

[57] ABSTRACT

A zig-zag V-groove configuration for use in V-MOS transistors is disclosed. Instead of merely forming parallel rows of V-grooves, a zig-zag configuration is used, utilizing two different directions for the V-grooves, at least one of which is not the conventional <011> direction. This configuration can be used with either the ladder or interdigitated configuration for the source contact and gate metals.

24 Claims, 5 Drawing Figures

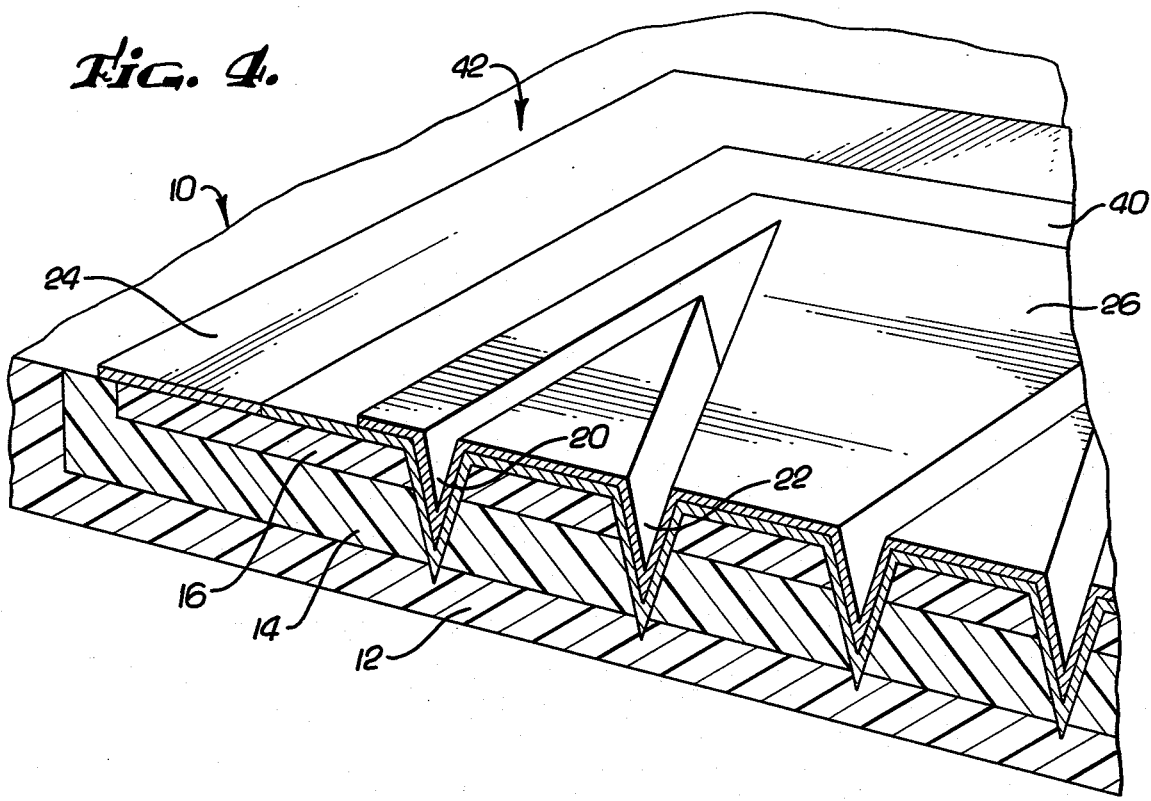
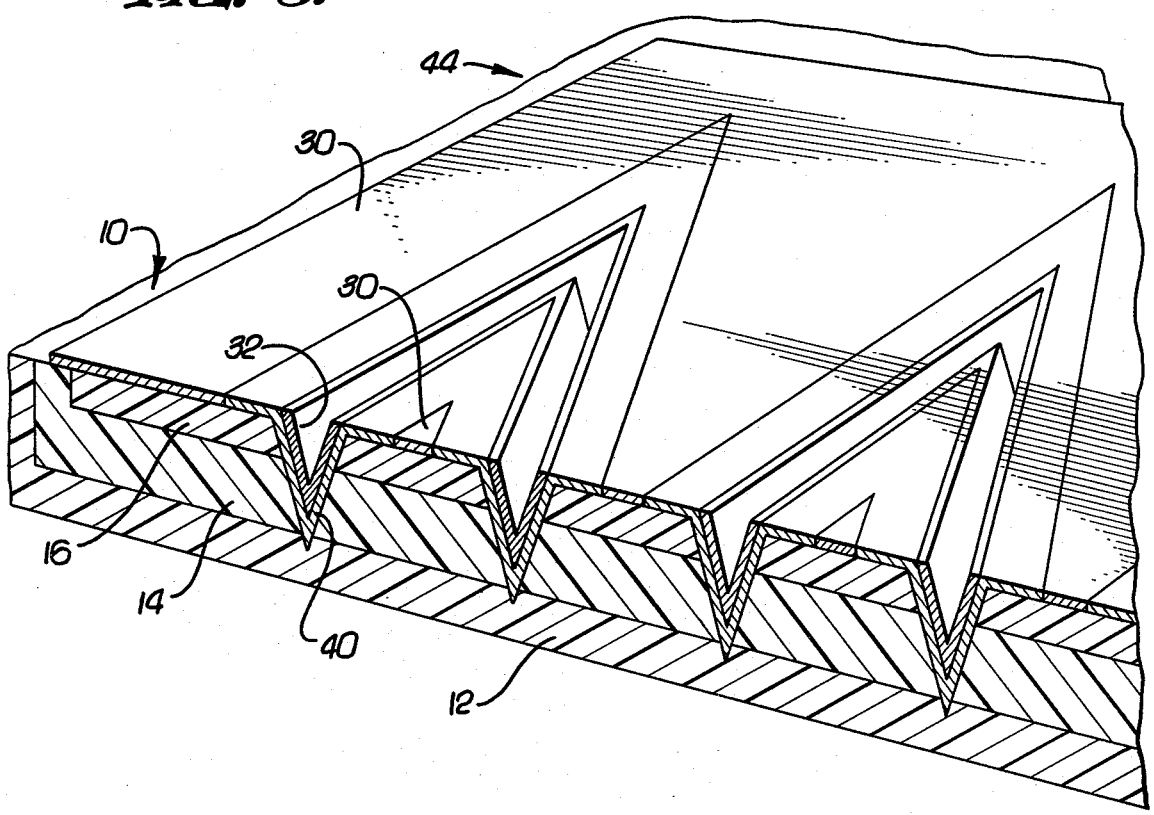

ZIG-ZAG V-MOS TRANSISTOR STRUCTURE

BACKGROUND OF THE INVENTION

1. Field of the Invention

This invention relates to V-MOS transistors, and more particularly, to the design of a zig-zag configuration for the V-grooves in such a device.

2. Description of the Prior Art

In the design of a V-MOS transistor, one of the objectives is to maximize the total width of the interconnected V-grooves within a specific area. This results in a maximum effective gate width per unit area. The more gate width per unit area available, the smaller the size of the device. The prior art solution has been to place the V-grooves as closely together as possible and thus achieve the maximum packing densities. However, under the prior art, the V-grooves were formed only in parallel lines either perpendicular or parallel to the direction of the $0\bar{1}1$ silicon crystallographic axis.

The disadvantage of the prior art method lies in the fact that when parallel lines of grooves are used, there is a limit to the packing density available. Using the prior art structure, as packing density increases, the source body connections become increasingly difficult to connect, especially with increasing width per groove. Thus, using the prior art structure, the designer of a V-MOS transistor is seriously constrained as to the packing density that he can design into his transistor.

BRIEF SUMMARY OF THE INVENTION

It is therefore an object of this invention to provide a V-MOS transistor structure with increased possible packing density by etching along two crystallographic sets of parallel planes to produce a zig-zag V-groove configuration.

It is also an object of this invention to provide a V-MOS transistor structure of the type described above wherein either a ladder configuration or an interdigitated configuration can be used for the positioning of the source contact metal and the gate metal.

Under the present invention, rather than etching grooves merely in a single crystallographic direction such as the <011> direction, grooves are formed along two separate axes. Examples of these axes may be the <0$\bar{1}$1> direction and the <0$\bar{1}$2> direction, with the surface of the device lying in the (100) plane.

By positioning the grooves such that the end of one groove in the <0$\bar{1}$1> direction is in contact with the end of one adjacent groove in the <0$\bar{1}$2> direction, etc., a zig-zag groove configuration can be obtained. In the example, the angle formed by the junction of the groove in the <0$\bar{1}$1> direction and the groove in the <0$\bar{1}$2> direction is 18°.

The benefit obtained from the zig-zag configuration is that the packing density, or the total length of the interconnected grooves in a given space, and hence the effective gate width, can be almost doubled using conventional techniques. This is because the parallel grooves in the <0$\bar{1}$1> direction can be placed the same distance apart as with the prior art, and thus the angled grooves in the <0$\bar{1}$2> direction which are placed in between these grooves result in that much added groove width.

By increasing the effective gate width in a given area, the size of the entire device may be reduced, or conversely, the capacity of a given size device may be increased.

The objective can be obtained using the above structure while retaining the same tolerances as with the prior art structure. Thus, the packing density of the V-MOS transistor can be greatly increased while retaining the same ease of manufacture as with the prior art.

The novel features which are believed to be characteristic of the invention, both as to its organization and method of operation, together with further objectives and advantages thereof, will be better understood from the following description considered in connection with the accompanying drawings in which a presently preferred embodiment of the invention is illustrated by way of example. It is to be expressly understood, however, that the drawings are for the purposes of illustration and description only, and are not intended as a definition of the limits of the invention.

BRIEF DESCRIPTION OF THE DRAWINGS

FIG. 4 is a cross-sectional view taken along line 4—4 of FIG. 2 showing the final structure of a zig-zag V-MOS transistor using the ladder configuration for the source contact and gate metals.

FIG. 5 is a cross-sectional view taken along line 5—5 of FIG. 3 showing the final structure of a V-MOS transistor using the interdigitated configuration for the source contact and gate metals.

DETAILED DESCRIPTION OF THE PREFERRED EMBODIMENT

Figure 1:
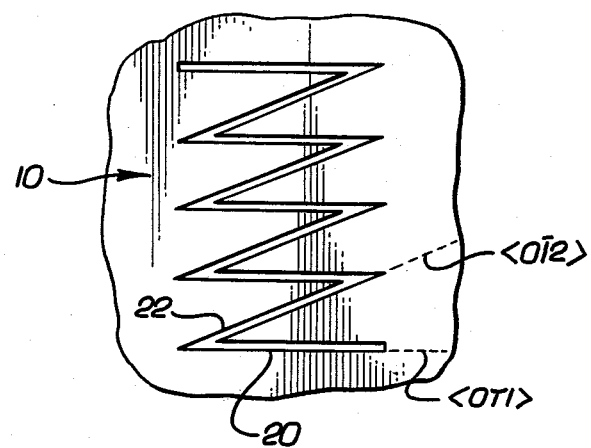
FIG. 1 is a perspective view of a portion of a silicon semiconductor device in which the etched zig-zag V-groove structure of the present invention has been etched.

Referring first to FIG. 1, there is shown a silicon semiconductor device 10. The device 10 comprises a substrate 12 of N+ type conductivity which acts as the drain for the semiconductor device 10, a body 14 of P-type conductivity, disposed on top of said substrate 12 and a source 16 of N+ type conductivity diffused into said body 14. The top surface of the device 10 lies in the (100) crystallographic plane. The V-grooves of the present invention are formed within the perimeter of the source region 16 and are formed sufficiently deep to extend through the source 16 and body 14 and into the substrate 12 but not through the substrate 12.

Using conventional mask and etch techniques, a plurality of grooves are formed in the surface of the wafer 10 substantially as shown in FIG. 1. One set of parallel grooves 20 is formed in the <0$\bar{1}$1> direction. The second set of parallel grooves 22, whose ends intersect the ends of the first set of grooves 20 such that a zig-zag pattern is formed, are formed in the <0$\bar{1}$2> direction. This is an improvement over the prior art wherein grooves are etched only along the major axes, much as in the <0$\bar{1}$1> direction.

The angle formed by the intersection of one of the first set of grooves 20 and one of the second set of grooves 22 is 18°. This results in a ratio between the length of one of the first set of grooves 20 and the separation between it and the next adjacent parallel groove 20 of approximately 3.08. By keeping this ratio constant one can vary the length of the grooves 20 and 22 to meet a variety of specifications.

The advantage gained by forming such a zig-zag structure as opposed to merely forming parallel grooves is that many more grooves per unit area can be formed. Transistors using the structure of the present invention can be formed with a distance between parallel grooves equivalent to that used in the prior art where only one set of parallel grooves is used, still allowing the angled grooves to be formed in between them. The result is that there is a greater effective gate length per unit area, which allows the design of smaller devices or devices with higher individual ratings than the same size prior art device.

In addition to using the $<0\bar{1}1>$ and the $<0\bar{1}2>$ directions for the two sets of grooves, several other combinations are possible under the present invention. For example, grooves in the $<0\bar{1}1>$ direction can be used with a second set of grooves in the $<0\bar{1}3>$ direction. This would result in an angle between the two sets of grooves of 26° and a length to separation ratio of approximately 2.05. It should also be noted that the directions $<0\bar{1}5>$, $<0\bar{1}6>$, $<0\bar{1}7>$, et seq., are useful under the present invention. However, as the angle becomes smaller and smaller the actual device will tend to approximate the prior art use of parallel grooves.

In addition, two sets of grooves other than the $<0\bar{1}1>$ direction may be used. For example, one set of grooves may be in the $<0\bar{1}2>$ direction and another set in the $<0\bar{1}3>$ direction. This will result in an angle between the two sets of grooves of 8° and a length to separation ratio of approximately 7.12.

In order to utilize these different crystallographic planes, one has to take into account the difference between the angles formed by intersection of the appropriate planes for each direction along which its grooves are etched. For instance, for the prior art direction (the $<0\bar{1}1>$ direction) the V-groove is formed in the angle between (111) planes. This angle (in the vertical plane) is 54.74°. For the different crystallographic planes utilized in the present invention, different planes are used and thus different angles are formed. For example, the angle between (221) planes (for the $<0\bar{1}2>$ direction) is 83.6°. There are similar differences for the other directions.

What this implies is that in order to terminate the grooves at the same depth, one has to use the appropriate width for the grooves. Thus, the appropriate opening width in the mask can be determined using crystallographic and etching properties known in the art.

Figure 2:
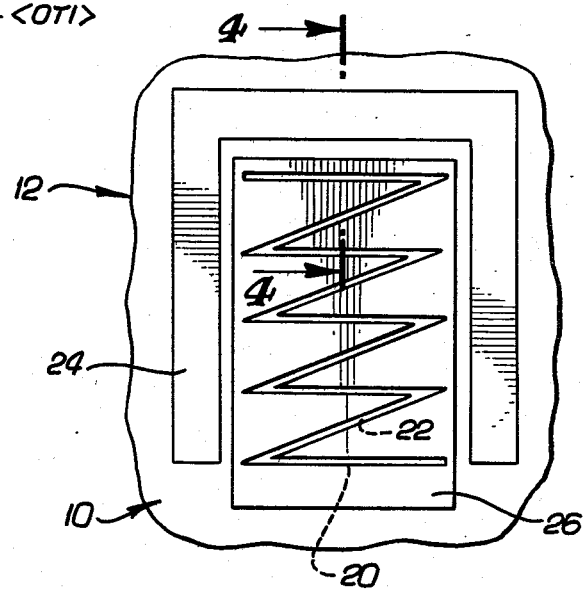
FIG. 2 is a perspective view of the semiconductor device of FIG. 1 onto which the source contact and gate metal have been disposed in the ladder configuration.

The zig-zag configuration of the present invention allows the source contact and gate metals of the semiconductor device to be deposited using two commonly used V-MOS configurations. Referring first to FIGS. 2 and 4, one can see the ladder configuration 42. In the ladder configuration 42, the source contact metal 24 is disposed in a solid strip around the perimeter of the V-grooved area directly on top of the source region 16. An insulating $SiO_2$ layer 40 is disposed over the area defined by the V-grooves 20 and 22 so that it is between the gate metal 26 and the source 16 and between the gate metal 26 and the surface of the grooves 20 and 22. The gate metal 26 is disposed in a single sheet to cover the area defined by the V-grooves 20 and 22. Electrical connections can be made to the substrate 12 which is the drain of the device 10 and to source contact 24 and to the gate 16 metal using conventional techniques.

Figure 3:
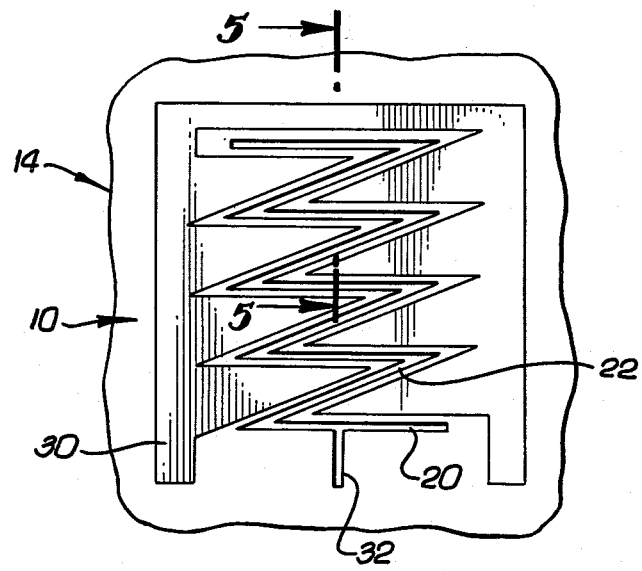
FIG. 3 is a perspective view of the semiconductor device of FIG. 1 onto which the source contact and gate metals have been disposed in the interdigitated configuration.

Referring next to FIGS. 3 and 5, one can see the interdigitated configuration 44. In the interdigitated configuration 44, the source contact metal 30 is disposed such that it covers the surface of the device 10 around the perimeter of the area defined by the grooves 20 and 22 and also is interdigitated into the area between each pair of grooves 20 and 22. The source contact metal 30 is once again in contact with the surface of the source 16. An insulating $SiO_2$ layer 40 is disposed on the surface of the wafer 10 over the grooves 20 and 22. The gate metal 32 is then disposed over the $SiO_2$ 40 in the grooves 20 and 22. Conventional techniques may be used to make electrical connections to the source contact metal 30 and the gate metal 32 as well as the substrate 12 which is the drain.

The ladder and interdigited configurations are two conventional designs for use with V-MOS transistors. The device 10 of the present invention is equally applicable to other conventional configurations for source contact and gate metals.

It should also be understood that the present application is equally applicable to a V-MOS device wherein there is an N− epitaxial layer between the substrate 12 and the channel 14. It is also possible to make other changes without departing from the spirit or scope of this invention. For example, different directions for the grooves may be utilized other than those specifically mentioned herein to form the zig-zag pattern of the present invention. Also, other configurations for the source and gate metals may be used. The present invention may be used on an N-channel device instead of the P-channel illustrated above. The invention, therefore, is not to be limited to the specific embodiment discussed and illustrated herein, but rather only by the scope of the appended claims.

I claim:

1. In a V-MOS transistor having source, body and substrate regions, a V-groove configuration comprising:
    a first set of parallel V-grooves disposed through the source and body regions and into the substrate region; and
    a second set of parallel V-grooves which are disposed at an intersecting angle with respect to said first set of V-grooves, and are also disposed through said source and body regions and into said substrate region, and are interleaved among said first set of grooves such that one end of each V-groove in said second set is in contact with one end of an adjacent V-groove in said first set and the other end of each said V-groove in said second set is in contact with one end of the other adjacent V-groove in said first set.

2. The configuration according to claim 1 wherein the surface of said source region lies in the (100) silicon crystallographic plane.

3. The configuration according to claim 1 wherein the first set V-grooves are disposed in the $<0\bar{1}1>$ crystallographic direction and the second set of V-grooves are disposed in one of the $<0\bar{1}2>$, the $<0\bar{1}3>$, the $<0\bar{1}4>$, the $<0\bar{1}5>$, or the $<0\bar{1}6>$ direction.

4. The configuration according to claim 1 wherein the first set V-grooves are disposed in the $<0\bar{1}2>$ crystallographic direction and the second set V-grooves are disposed in the $<0\bar{1}3>$ direction.

5. The configuration according to claim 1 wherein the width of each V-groove is controlled such that the depth of each V-groove is the same with respect to the different sets of V-grooves.

6. A V-MOS transistor device comprising:
a silicon substrate of one type conductivity;
a body region disposed on top of said substrate and having a conductivity type opposite to that of said substrate;
a source region of the same type conductivity as said substrate disposed on said body region;
a plurality of V-grooves in a zig-zag configuration disposed within said source region and which extend through said source region and said body region and into said substrate;
an insulating layer disposed on the surface of the device covering the V-grooved area;
a gate metal layer disposed over said insulating layer and;
a source contact metal layer disposed on the surface of and in contact with said source region not covered by said insulating layer.

7. the device according to claim 6 wherein said zig-zag configuration comprises:
a first set of parallel V-grooves; and
a second set of parallel V-grooves which are disposed at an intersecting angle with respect to said first set of V-grooves and are interleaved among said first set of grooves such that one end of each V-groove in said second set is in contact with one end of an adjacent V-groove in said first set and the other end of each said V-groove in said second set is in contact with one end of the other adjacent V-groove in said first set.

8. The device according to claim 7 wherein the surface of said source region lies in the (100) silicon crystallographic plane.

9. The device according to claim 7 wherein the first set of V-grooves are disposed in the <0$\bar{1}$1> crystallographic direction and the second set of V-grooves are disposed in the <0$\bar{1}$2>, the <0$\bar{1}$3>, the <0$\bar{1}$4>, the <0$\bar{1}$5>, or the <0$\bar{1}$6> direction.

10. The device according to claim 7 wherein the first set V-grooves are disposed in the <0$\bar{1}$2> crystallographic direction and the second set of V-grooves are disposed in the <0$\bar{1}$3> direction.

11. The device according to claim 7 wherein the width of each V-groove is controlled such that the depth of each V-groove is the same.

12. The device according to claim 6 wherein the source and gate metals are disposed in the ladder configuration.

13. The device according to claim 12 wherein said ladder configuration comprises:
a generally rectangular insulating layer with a rectangular sheet of gate metal disposed thereon, disposed over the entire area defined by the V-grooves; and
a strip of source contact metal disposed over the remaining surface area of the source region.

14. The device according to claim 6 wherein the source contact and gate metals are disposed in the interdigitated configuration.

15. The device according to claim 14 wherein said interdigitated configuration comprises:
an insulating layer with a continuous line of gate metal disposed thereon, disposed substantially only in the V-grooves; and
a continuous strip of source contact metal disposed over the remaining surface area of the source region such that portions of said source metal extend into the triangular area between each pair of adjacent V-grooves and thus are interdigitated therewith.

16. A method for fabricating a V-MOS transistor device having a source region in a silicon wafer which is disposed within a body region which, in turn, is disposed on top of a silicon substrate, the improvement comprising;
forming a plurality of V-grooves in the source region, wherein said V-grooves are disposed in a zig-zag configuration and extend through said source region and said body region and into said substrate region; and
disposing oxide insulation and contact source and gate metals on said wafer.

17. The method according to claim 16 wherein said zig-zag configuration comprises:
a first set of parallel V-grooves disposed in the surface of a silicon source region; and
a second set of parallel V-grooves which are disposed at an intersecting angle with respect to said first set of V-grooves disposed in the surface of said source region interleaved among said first set of grooves such that one end of each V-groove in said second sets is in contact with one end of an adjacent V-groove in said first set and the other end of each said V-groove in said second set is in contact with one end of the other adjacent V-groove in said first set.

18. The method according to claim 17 wherein the surface of said source region lies in the (100) silicon crystallographic plane.

19. The method according to claim 17 wherein the first set of V-grooves are disposed in the <0$\bar{1}$1> crystallographic direction and the second set of V-grooves are disposed in one of the <0$\bar{1}$2>, the <0$\bar{1}$3>, the <0$\bar{1}$4>, the <0$\bar{1}$5>, or the <0$\bar{1}$6> direction.

20. The method according to claim 17 wherein the first set of V-grooves are disposed in the <0$\bar{1}$2> crystallographic direction and the second set of V-grooves are disposed in the <0$\bar{1}$3> direction.

21. The method according to claim 17 wherein the width of each V-groove is controlled such that the depth of each V-groove is the same.

22. In a V-MOS transistor of the type formed in a semiconductor structure and having vertically layered source, body and drain regions within said body, the improvement comprising:
a zig-zag shaped V-groove extending downward from a surface of said structure into said drain region, said zig-zag V-groove including a first set of groove segments extending along one crystallographic direction and a second set of grooves segments extending along a second crystallographic direction intersecting said first direction;
an insulating layer covering at least said V-groove; and
gate metalization disposed atop said insulating layer at least along said zig-zag shaped V-groove.

23. The improvement of claim 22 wherein said insulating layer and said gate metalization additionally are disposed over a substantial portion of the semiconductor structure surface between adjacent zig-zag V-groove segments.

24. The improvement of claim 22 wherein said gate metalization is substantially limited to coincide with said zig-zag V-groove, and wherein contact metalization for one of said source or drain regions substantially covers the triangular regions on the surface of said structure between adjacent zig-zag V-groove segments.

* * * * *